United States Patent [19]

Ikeda et al.

[11] Patent Number: 5,043,994
[45] Date of Patent: Aug. 27, 1991

[54] SEMICONDUCTOR LASER DEVICE

[75] Inventors: Kenji Ikeda; Kimio Shigihara, both of Itami, Japan

[73] Assignee: Mitsubishi Denki Kabushiki Kaisha, Japan

[21] Appl. No.: 523,545

[22] Filed: May 15, 1990

[30] Foreign Application Priority Data

Jun. 15, 1989 [JP] Japan .................. 1-153188

[51] Int. Cl.$^5$ .............................................. H01S 3/19
[52] U.S. Cl. ...................................... 372/45; 372/96; 372/49
[58] Field of Search ...................... 372/45, 43, 49, 96

[56] References Cited
U.S. PATENT DOCUMENTS 4,888,783 12/1989 Kojima et al. ................. 372/96

FOREIGN PATENT DOCUMENTS 56-1589 1/1981 Japan .
0186083 9/1985 Japan ................................ 372/96
63-205984 8/1988 Japan .

OTHER PUBLICATIONS

Wittke et al., "Lateral Mode . . . Laser", Journal of Applied Physics, vol. 48, No. 7, Jul. 1977, pp. 3122–3124.
Kojima et al., "Continuous Wave . . . Laser", Applied Physics Letters, vol. 50, No. 24, 1987, pp. 1705–1707.

Primary Examiner—Georgia Epps
Attorney, Agent, or Firm—Leydig, Voit & Mayer

[57] ABSTRACT

A semiconductor laser device having a relative wide active region and a distributed Bragg reflector facet wherein a relative high reflectance region one third of the active region width is centrally disposed on a surface of the laser through which light is emitted.

3 Claims, 5 Drawing Sheets

SEMICONDUCTOR LASER DEVICE

FIELD OF THE INVENTION

The present invention relates to a surface emitting type semiconductor laser device of the distributed Bragg reflector (hereinafter referred to as "DBR") type and, more particularly, to a DBR surface emitting type semiconductor laser oscillating at a high output power and a single, fundamental mode.

BACKGROUND OF THE INVENTION

FIG. 9 shows a structure of a prior art DBR surface emitting type laser device, reported in Applied Physics Letters, 50(24), pp 1705 to 1707, 1987 by K. Kojima et al. In FIG. 9, reference numeral 2 denotes a semiconductor substrate. An n side electrode 1 is provided at the bottom of the substrate 2. On the substrate 2, a lower cladding layer 3, an active layer 4, and an upper cladding layer 5 are successively provided. A diffraction grating 7 is provided at the surface of the upper cladding layer 5. A dielectric film 6 is provided on the portion of the upper cladding layer 5 where the distributed Bragg reflector is provided. A contact layer 9 is provided on a current injection region of the upper cladding layer 5. A p side electrode 8 is provided on the surface of the laser. Reference numeral 10a denotes a narrow active region for obtaining a single, fundamental mode oscillation.

The laser operates as follows. The light which transits the resonator is mainly confined in the active layer 4, but a part of the light reaches the upper and lower cladding layers 3 and 5. When diffraction gratings 7 are provided in the upper cladding layer, the advancing direction of light is determined by the phase of the light reflected (scattered) from the respective faces of the diffraction grating. When the interval between the two gratings is an integer multiple of $\lambda/2$ (where $\lambda$ is wavelength), the light returns toward the original direction, and the light transits in many directions when the integer multiple is large. When the interval is an even number times of $\lambda/2$, the light also transits in the direction perpendicular to the substrate 2. This prior art laser device operates as a surface emitting type based on the above-described principle, and the width of the stripe is ordinary narrowed to 3 to 4 microns to obtain a fundamental transverse oscillation mode of the laser.

The prior art DBR surface emitting type semiconductor laser device has a narrow active region stripe, and therefore there arises a problem in that when the injected current is increased to obtain a high output power, destruction of the facet, or Catastrophic Optical Damage (COD) occurs because of heat and the maximum output power is restricted. Furthermore, there arises another problem in that when the active region is widened to obtain a high output power, higher order transverse mode oscillation takes place.

SUMMARY OF THE INVENTION

It is an object of the present invention to provide a semiconductor laser device producing a high output power and a transverse fundamental mode oscillation by widening the active region.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a semiconductor laser device having a wide active region, in which one of a pair of resonator facets is a DBR and the other resonator facet is a crystal cross-section, a relatively high reflectance region of one third the width of the active region width is provided at about the center of the active region of the crystal cross-section or of the DBR side crystal cross-section, and the other portion of the active region is of a relatively low reflectance. Therefore, the threshold gain of the fundamental mode is minimized, and the gain difference thereof from higher order modes is increased to a great extent.

According to a second aspect of the present invention, in a semiconductor laser device having a wide active region in which at least one of a pair of cavity reflectors is constituted by a DBR, the coupling coefficient $\kappa$ of the DBR is high at the center of the active region and low at both side portions. Therefore, the threshold gain of the fundamental mode is minimized, and the gain difference thereof from the higher order modes is increased to a great extent.

According to a third aspect of the present invention, in a semiconductor laser device having a wide active region in which at least one of a pair of cavity reflectors is constituted by a DBR, the reflectance of the center portion of the active region on an output surface of the DBR is increased. Therefore, the threshold gain of the fundamental mode is minimized, and the gain difference thereof from the higher order modes is increased to a great extent.

DETAILED DESCRIPTION OF THE PREFERRED EMBODIMENTS

An embodiment of the present invention will be described in detail with reference to the drawings.

Figure 1:
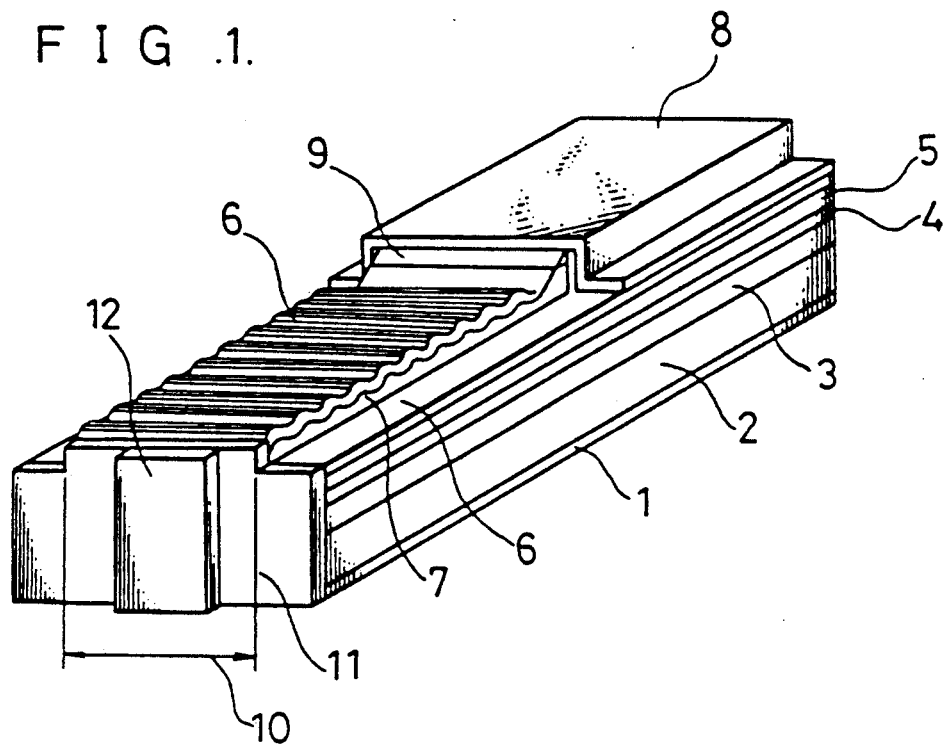
FIG. 1 is a view of a DBR surface emitting type laser device according to a first embodiment of the present invention.

FIG. 1 is a perspective view showing a structure of a DBR surface emitting type semiconductor laser device according to a first embodiment of the present invention. In FIG. 1, reference numeral 2 denotes a semiconductor substrate. Reference numeral 1 denotes an n side electrode provided at the bottom of the substrate 2. On the substrate 2, a lower cladding layer 3, an active layer 4, and an upper cladding layer 5 are successively provided. A diffraction grating 7 is provided on the upper cladding layer 5. A dielectric film 6 is provided on a portion of the upper cladding layer 5 where a DBR is provided. A contact layer 9 is provided on a current injection region of the upper cladding layer 5. A p side electrode 8 is provided on the surface of the laser device. Reference numeral 10 designates the width of the active region. A relatively low reflectance region 11 is provided at the crystal cross-section, and a relatively high reflectance region 12 is provided at the center part of the crystal cross-section.

The width of the active region (hereinafter referred to as "$W_o$") is sufficiently wide to obtain a high output power, and transverse higher order mode oscillation is possible. The width of high reflectance region 12 is about $W_o/3$.

Figure 4:
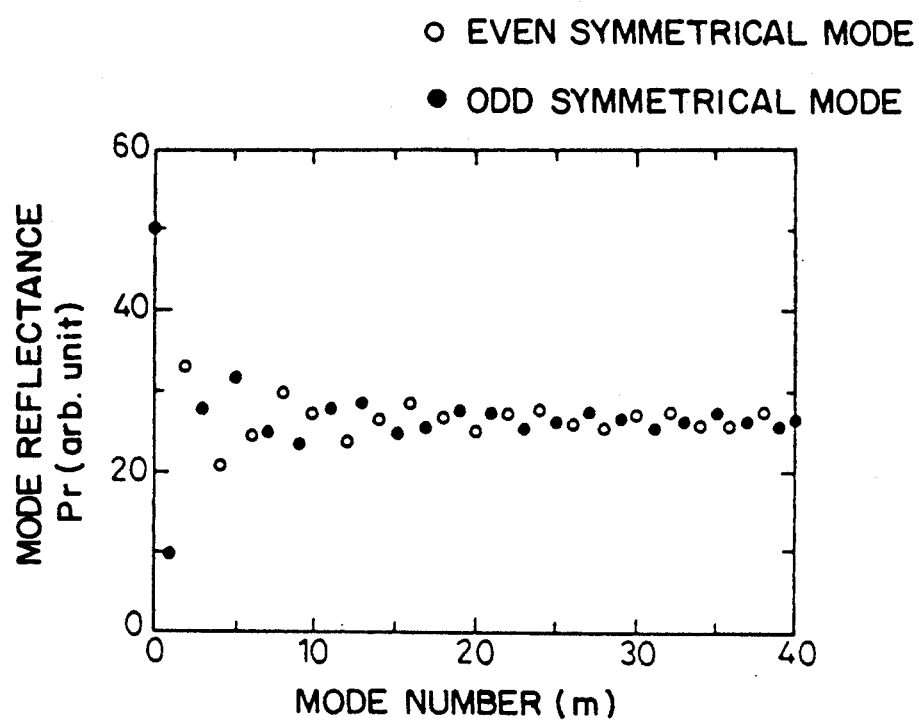
FIG. 4 is a diagram showing mode reflectances at respective modes.

FIG. 4 is a diagram showing mode reflectances (Pr) of the respective modes defined as follows.

$$Pr = \frac{\left|\int_{-\beta}^{\beta} Em(x)dx\right|^2}{\left|\int_{-\infty}^{\infty} Em(x)dx\right|^2} \quad (1)$$

In FIG. 4, the width of the active region $W_o$ is to 150 microns, the width of the high reflectance region $2b$ is 40 microns, the refractive index of the active layer is 3.4554, and that of the cladding layer 3.4453.

As is evident from FIG. 4, the mode reflectance which is the ratio of reflection within the region of 2B width to the entire reflection quantity, is maximized at the fundamental mode (0-th order).

Figure 5:
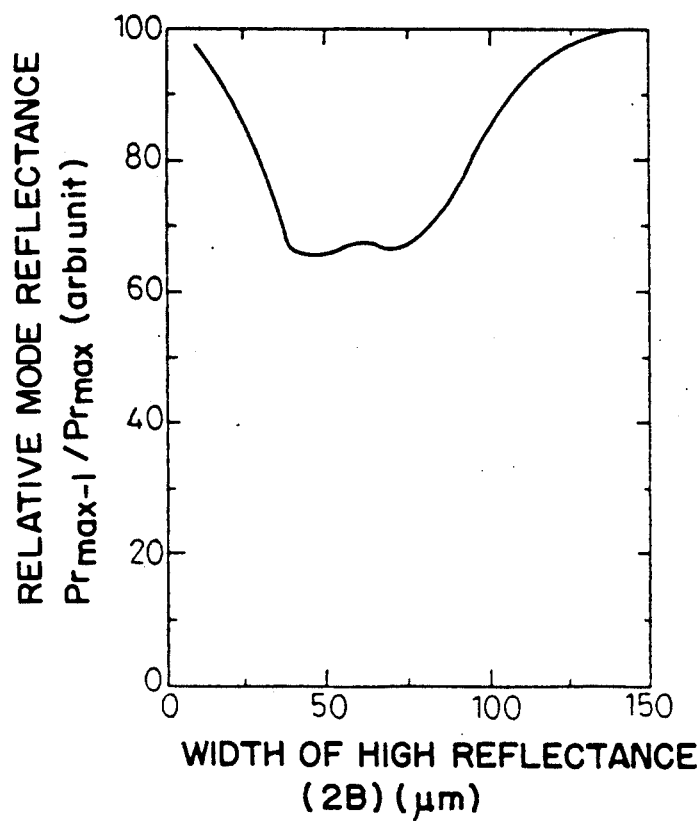
FIG. 5 is a diagram showing high reflectance region width versus relative mode reflectance characteristics.

FIG. 5 is a diagram showing the high reflectance region width 2B versus relative mode reflectance characteristics. The relative mode reflectance is the ratio of the mode reflectance at the secondary largest mode (Pr max-1) to the mode reflectance at the fundamental mode (Pr max). From FIG. 5, the fundamental mode is likely to oscillate when the width of the high reflectance region is made one third of that of the active region.

In the laser device shown in FIG. 1, a high reflectance region 12 with one third the width of the active region 10 width $W_o$ is provided at the center part of the crystal cross-section, whereby a single transverse mode oscillation is obtained from the above-described mechanism.

Figure 6:
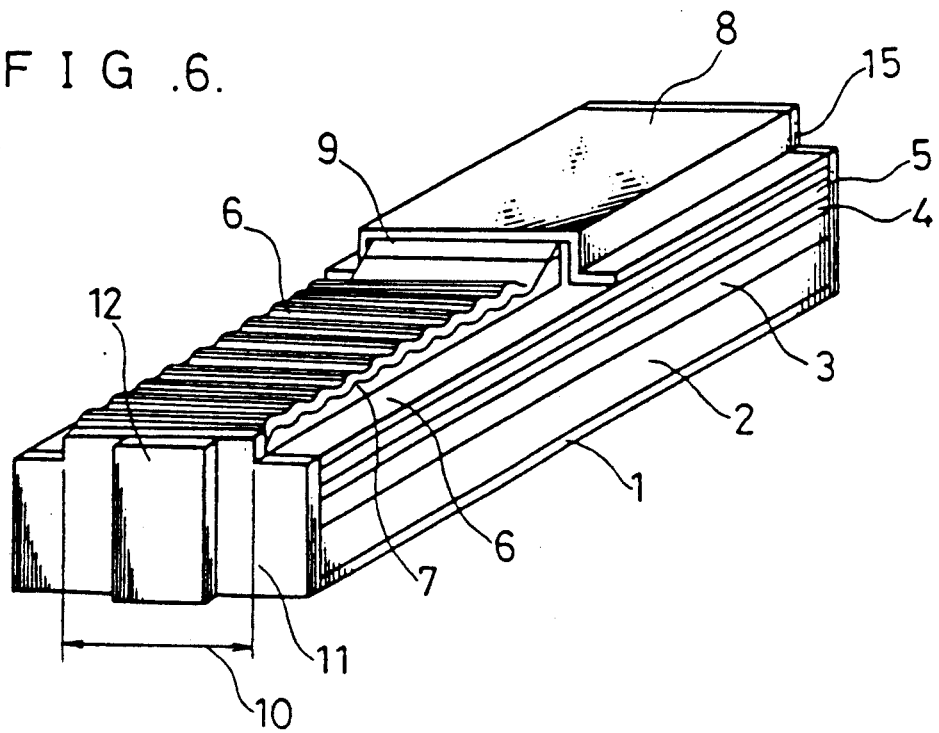
FIGS. 6 and 7 are views each showing a modification of the first embodiment.
Figure 7:
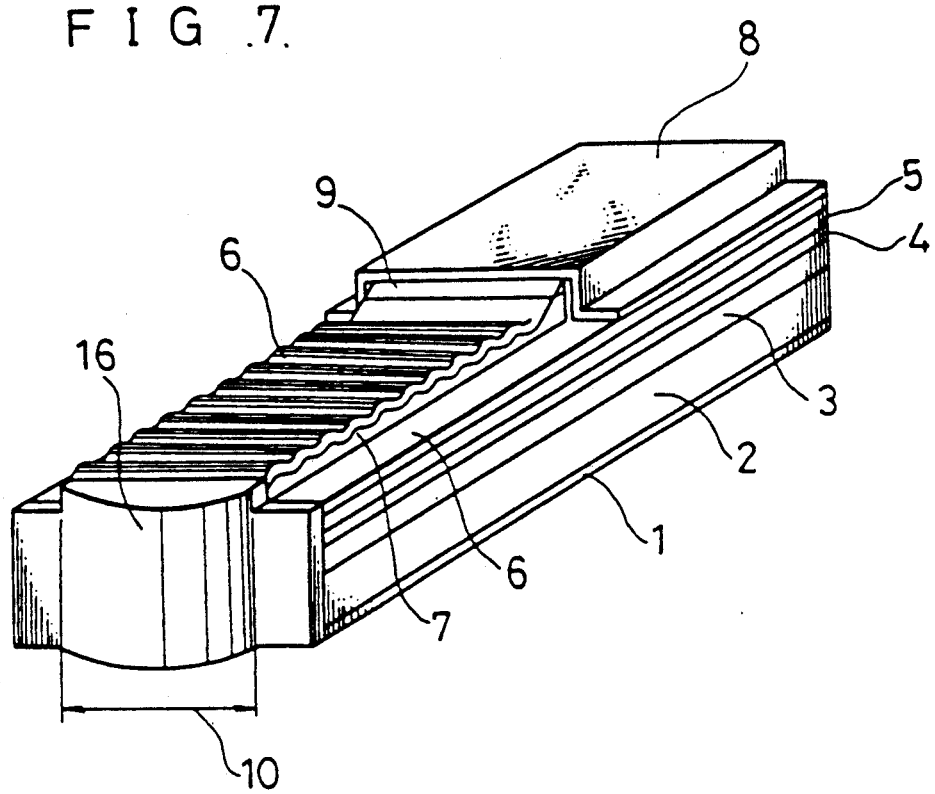

FIGS. 6 and 7 are perspective views showing modifications of the first embodiment. In these figures, the same reference numerals denote the same elements as those shown in FIG. 1. A high reflectance region 15 is provided at the rear facet of the laser cavity in FIG. 6. In FIG. 7, reference numeral 16 denotes a region having a reflectance which gradually changes in the direction of the active region width.

In the laser device shown in FIG. 6, a rear side crystal cross-section has a relatively high reflectance portion 15 for efficiently taking out light, whereby the same effect as the first embodiment is obtained and the threshold current is reduced.

In the laser device shown in FIG. 7, the reflectance of the center part of the stripe of the active region is made relatively high and the reflectances of both side portions are made relatively low, by providing a portion where the reflectance gradually changes at the crystal cross-section, whereby the same effects as the first embodiment are obtained.

Figure 2:
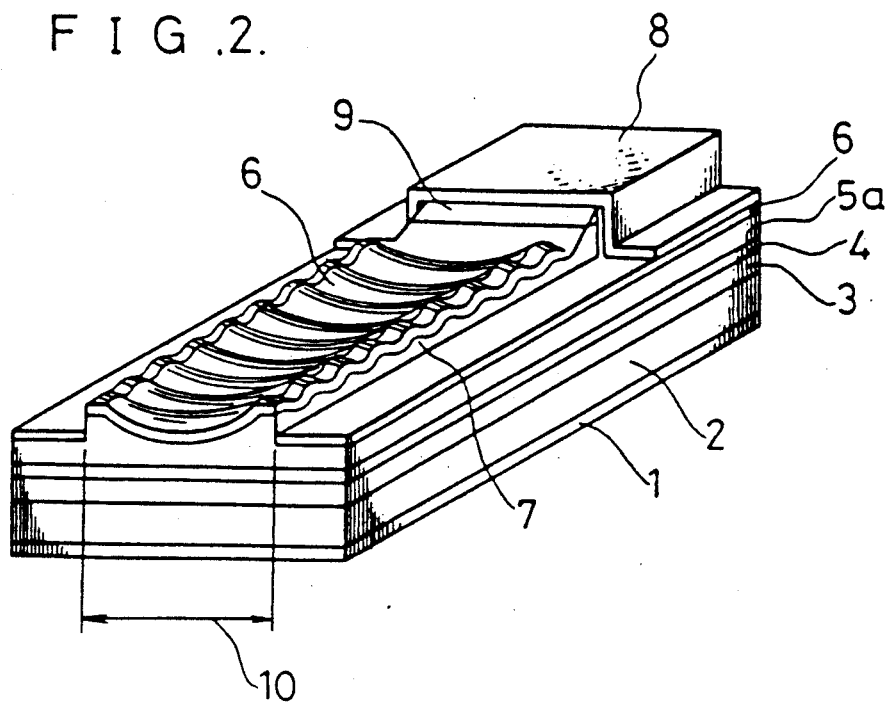
FIG. 2 is a view of a DBR surface emitting type laser device according to a second embodiment of the present invention.

FIG. 2 is a perspective view showing a structure of a semiconductor laser device according to a second embodiment of the present invention. In FIG. 2, reference numeral 5a designates an upper cladding layer which is thinned at the center of the stripe so as to make the coupling coefficient κ of the DBR relatively high at the center part of the active region and relatively low at both side portions.

Herein, the upper cladding layer is thinned at the center of the stripe, and the coupling coefficient κ for the secondary grating is relatively high the neighborhood of the center portion. While the electric field distribution of the fundamental mode has its peak at the center of the stripe, the electric field distributions of the other higher-order modes have many peaks at the region, broadening toward the outside, thereby maximizing the coupling coefficient $\kappa_o$ of the fundamental mode and producing a fundamental mode oscillation at high output.

Figure 3:
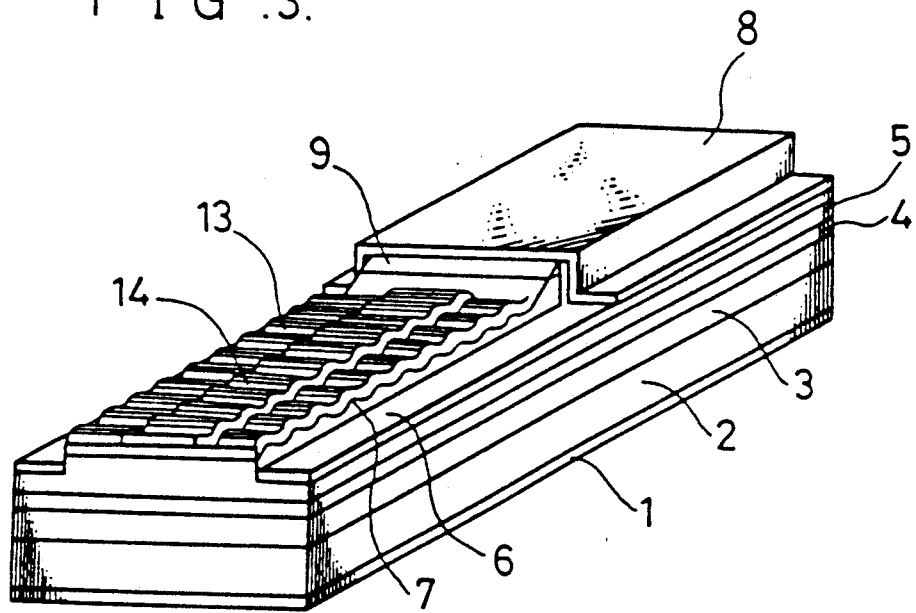
FIG. 3 is a view of a DBR surface emitting type laser device according to a third embodiment of the present invention.

FIG. 3 is a perspective view showing the structure of a semiconductor laser device according to a third embodiment. In FIG. 3, reference numeral 13 denotes a low reflectance region on the DBR and reference numeral 14 denotes a high reflectance region provided on the DBR.

In this third embodiment, different from the semiconductor laser device as the first embodiment, a high reflectance portion and a low reflectance portion are provided on the DBR. The principle of operation of this embodiment is the same as that of the first embodiment. To be more concrete, the threshold gain of the fundamental mode is minimized by increasing the reflectance at the center of the active region, whereby fundamental mode oscillation is obtained in a DBR surface emitting type semiconductor laser device which has a wide active region and oscillates at high output.

Figure 8:
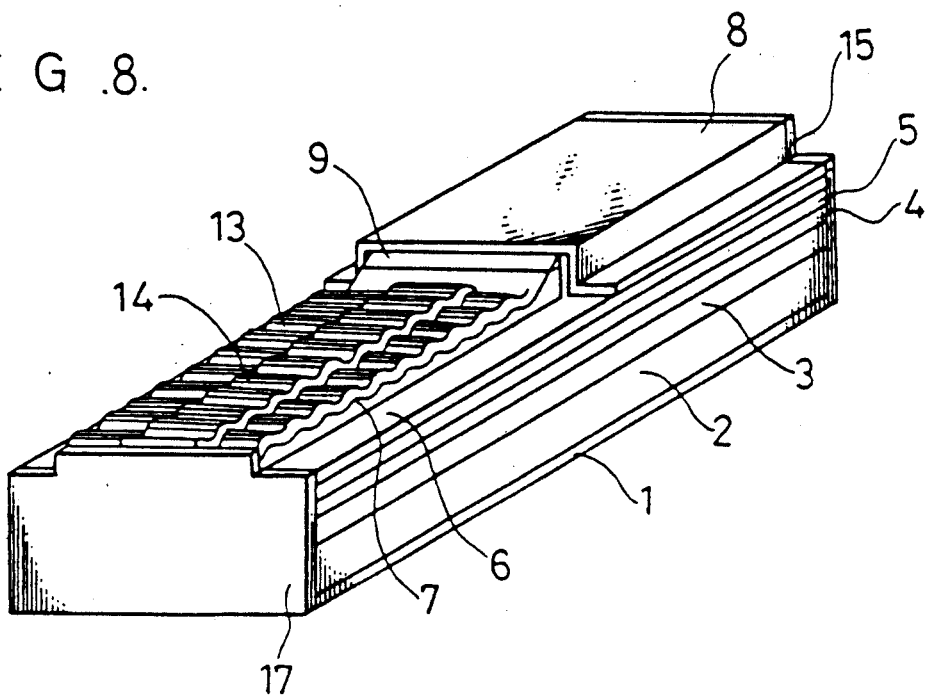
FIG. 8 is a view showing a modification of the third embodiment.
Figure 9:
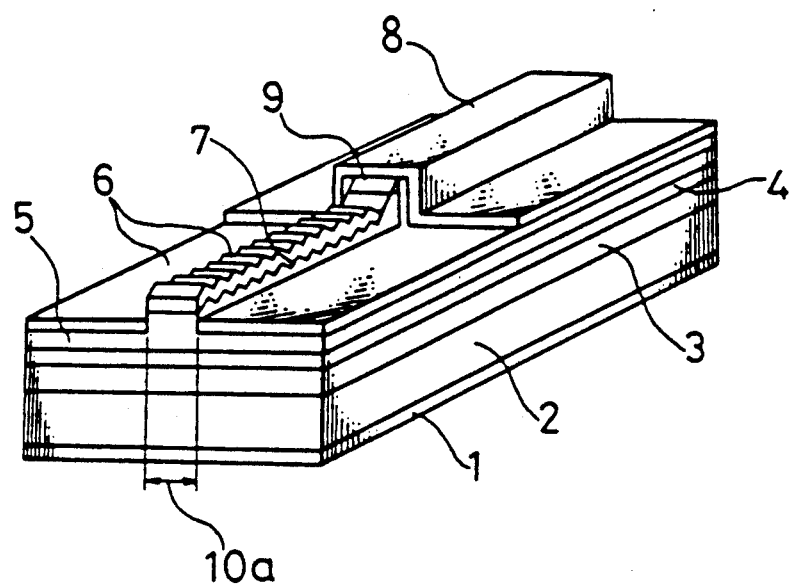
FIG. 9 is a view of a prior art DBR surface emitting type semiconductor laser device.

FIG. 8 is a perspective view of a modification of the third embodiment. Herein, relatively high reflectance regions 17 and 15 are provided on the front and rear crystal cross-sections, respectively, to efficiently take out the light, whereby the same effects as the third embodiment are obtained as well as the threshold current is reduced.

While in the above-illustrated embodiments, the crystal cross-sections are formed by cleavage, the crystal cross-sections may be formed by etching.

As is evident from the foregoing description, according to a first embodiment of the present invention, a high reflectance region of one third the width of the active region width is provided at the center part of the front or rear crystal, cross-section. Therefore, a semiconductor laser device producing a high output power and single transverse mode oscillation is provided.

According to a second embodiment of the present invention, the coupling coefficient κ at the center part of the active region is increased by thinning the upper cladding layer at the center part of the stripe. Therefore, a semiconductor laser device producing a high output power and single transverse mode oscillation is provided.

According to a third embodiment of the present invention, the reflectance of the center part of the active region on an output surface of the DBR is increased. Therefore, a semiconductor laser device producing a high output power and single transverse mode is obtained.

What is claimed is:

1. A semiconductor laser device comprising first and second cladding layers, an active layer sandwiched between and having a thickness transverse to said first and second cladding layers, a semiconductor substrate on which said second cladding layer is disposed, said first cladding layer including a distributed Bragg reflector through which light is emitted, first and second substantially planar surfaces transverse to said active layer, said first planar surface having a width transverse to the thickness of said active layer, a relatively low reflectance coating disposed on said first planar surface, a relatively high reflectance coating about one third the width of the active layer disposed on said relatively low reflectance coating substantially centered relative to said active layer, and first and second electrodes disposed on said substrate and said first cladding layer, respectively.

2. A semiconductor laser device comprising first and second cladding layers and an active layer sandwiched between said first and second cladding layers, a semiconductor substrate on which said second cladding layer is disposed, said first cladding layer including a distributed Bragg reflector having an external surface through which light is emitted, first and second electrodes disposed on said substrate and part of said first cladding layer, respectively, wherein said external surface includes a curvature whereby a coupling coefficient $\kappa$ of the reflector is relatively high at the central part of said active layer and relatively low outside the central part of said active layer.

3. A semiconductor laser device comprising first and second cladding layers and an active layer sandwiched between said first and second cladding layers, a semiconductor substrate on which said second cladding layer is disposed, first and second electrodes disposed on said substrate and part of said first cladding layer, respectively, said first cladding layer including a distributed Bragg reflector having an external surface through which light is emitted, a relatively low reflectance coating disposed on said external surface, and a relatively high reflectance coating disposed on part of said external surface substantially centered relative to said active layer.

* * * * *